United States Patent
Boyle

(10) Patent No.: US 8,035,139 B2
(45) Date of Patent: Oct. 11, 2011

(54) DYNAMIC RANDOM ACCESS MEMORY HAVING JUNCTION FIELD EFFECT TRANSISTOR CELL ACCESS DEVICE

(75) Inventor: Douglas B. Boyle, Saratoga, CA (US)

(73) Assignee: SuVolta, Inc., Los Gatos, CA (US)

( * ) Notice: Subject to any disclaimer, the term of this patent is extended or adjusted under 35 U.S.C. 154(b) by 459 days.

(21) Appl. No.: 12/194,651

(22) Filed: Aug. 20, 2008

(65) Prior Publication Data

US 2009/0057728 A1   Mar. 5, 2009

Related U.S. Application Data

(60) Provisional application No. 60/967,554, filed on Sep. 2, 2007.

(51) Int. Cl.
 *H01L 29/66* (2006.01)
(52) U.S. Cl. .. 257/256; 257/272; 257/392; 257/E21.631
(58) Field of Classification Search .................. 257/205, 257/213, 256, 272, 273, 392, E21.631
 See application file for complete search history.

(56) References Cited

U.S. PATENT DOCUMENTS

| | | | |
|---|---|---|---|
| 3,387,286 A * | 6/1968 | Dennard | ...................... 365/222 |
| 3,412,286 A | 11/1968 | Grebene | |
| 3,936,929 A | 2/1976 | Bean et al. | |
| 3,951,702 A | 4/1976 | Kano et al. | |
| 3,967,305 A | 6/1976 | Zuleeg | |
| 3,986,180 A | 10/1976 | Cade | |
| 4,126,899 A | 11/1978 | Lohstroh et al. | |
| 4,126,900 A * | 11/1978 | Koomen et al. | .......... 365/185.01 |
| 4,228,367 A | 10/1980 | Brown | |
| 4,333,224 A | 6/1982 | Buchanan | |
| 4,638,344 A | 1/1987 | Cardwell, Jr. | |
| 4,751,556 A | 6/1988 | Cogan et al. | |
| 4,777,517 A | 10/1988 | Onodera et al. | |
| 4,791,611 A | 12/1988 | Eldin et al. | |
| 5,130,770 A | 7/1992 | Blanc et al. | |
| 5,140,551 A * | 8/1992 | Chiu | ........................ 365/185.08 |
| 5,243,209 A | 9/1993 | Ishii | |

(Continued)

FOREIGN PATENT DOCUMENTS

| | | |
|---|---|---|
| EP | 0 050 772 A2 | 5/1982 |
| GB | 2208967 A | 4/1989 |

(Continued)

OTHER PUBLICATIONS

PCT International Search Report for International Application No. PCT/US2008/074706, dated Mar. 30, 2009.

(Continued)

*Primary Examiner* — Evan Pert
*Assistant Examiner* — Scott R Wilson
(74) *Attorney, Agent, or Firm* — Haverstock & Owens, LLP

(57) ABSTRACT

A dynamic random access memory (DRAM) device can include a plurality of memory cells. Each memory cell can include a charge storing structure and an access device comprising an enhancement mode junction field effect transistor (JFET). The DRAM device can further include a plurality of sense amplifiers that each generates an output value in response to a signal received at respective sense amplifier inputs, and a plurality of bit lines, each bit line coupling a plurality of memory cells to at least one input of at least one of the sense amplifiers. A method can fabricate such DRAM devices.

5 Claims, 12 Drawing Sheets

U.S. PATENT DOCUMENTS

| | | | |
|---|---|---|---|
| 5,393,998 | A | 2/1995 | Ishii et al. |
| 5,589,409 | A | 12/1996 | Bulucea et al. |
| 5,618,688 | A | 4/1997 | Reuss |
| 5,773,891 | A | 6/1998 | Delgado |
| 5,973,341 | A | 10/1999 | Letavic et al. |
| 2002/0197779 | A1 | 12/2002 | Evans |
| 2007/0096144 | A1 | 5/2007 | Kapoor |
| 2007/0284628 | A1 | 12/2007 | Kapoor |
| 2008/0001183 | A1 | 1/2008 | Kapoor |
| 2008/0237657 | A1 | 10/2008 | Kapoor |
| 2008/0273398 | A1 | 11/2008 | Vora |

FOREIGN PATENT DOCUMENTS

| | | |
|---|---|---|
| JP | 60258948 A | 12/1985 |
| JP | 08-78435 A | 3/1996 |

OTHER PUBLICATIONS

PCT Written Opinion of the International Searching Authority for International Application No. PCT/US2009/074706, dated Mar. 30, 2009.

Heald et al., Multilevel Random-Access Memory Using One Transistor Per Cell, IEEE Journal of Solid-State Circuits, Aug. 1976, vol. SC-11, No. 4, pp. 519-528.

Shin et al., A High-Speed Low-Power JFET Pull-Down ECL Circuit, IEEE Journal of Solid-State Circuits, Apr. 1991, vol. 26, No. 4, pp. 679-682.

Horowitz et al., "Non-Volatile and Fast Static Memories", ISSCC 90, Feb. 14, 1990, pp. 68-69, 267.

* cited by examiner

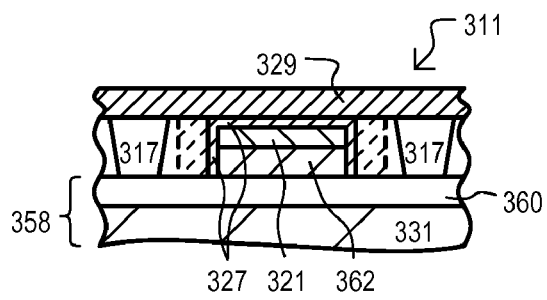
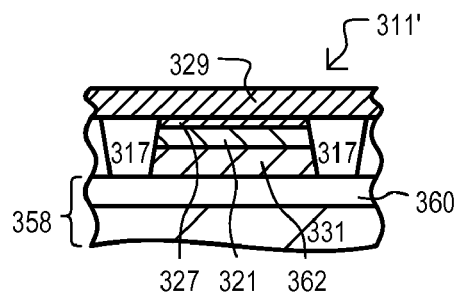
FIG. 3D  FIG. 3E
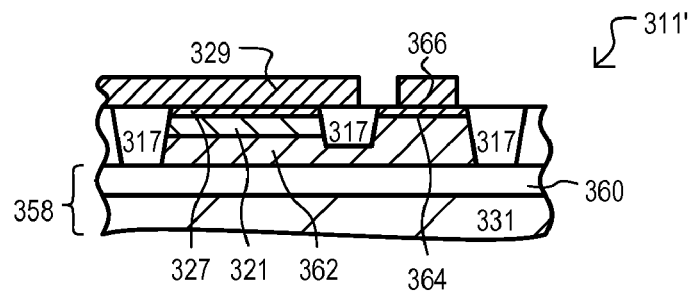
FIG. 3F
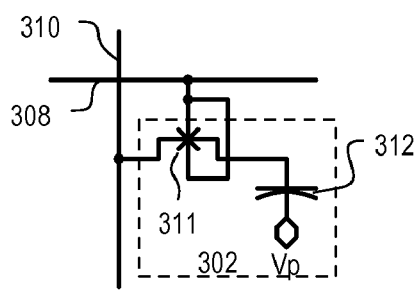
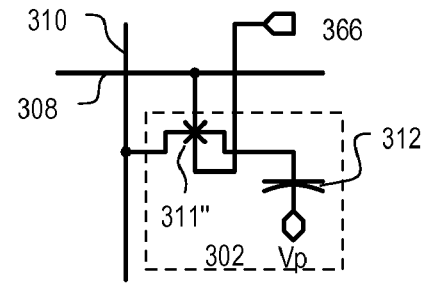
FIG. 3G-0  FIG. 3G-1
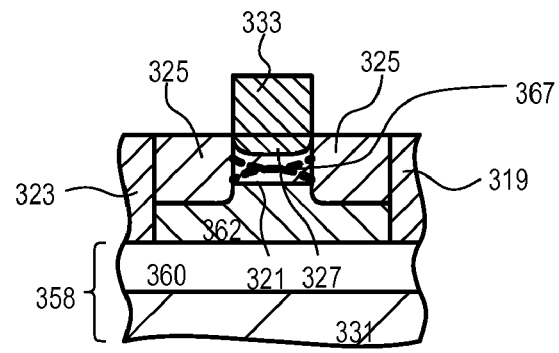
FIG. 3H // DYNAMIC RANDOM ACCESS MEMORY HAVING JUNCTION FIELD EFFECT TRANSISTOR CELL ACCESS DEVICE This application claims the benefit of U.S. provisional patent application Ser. No. 60/967,554, filed on Sep. 2, 2007, the contents of which are incorporated by reference herein.

TECHNICAL FIELD

The present invention relates generally to semiconductor memory devices, and more particularly to dynamic random access memories (DRAMs) that can include a capacitive structure as a data storage element.

BACKGROUND OF THE INVENTION

Dynamic random access memories (DRAMs) enjoy wide application as storage circuits in electronic devices due to their compact cell size and relatively low power consumption. A typical conventional DRAM device can include an array of DRAM memory cells, each of which can be formed by a metal-oxide-semiconductor (MOS) type access transistor and a storage capacitor. In a write operation to a conventional DRAM cell, a storage capacitor can be charged via the source-drain path of the MOS access transistor to store one logic value (i.e., "1"), or discharged to store another logic value (i.e., "0"). To retain data, the MOS access transistor is turned off. In order to ensure that valid data continues to be stored, conventional DRAM cells must be periodically refreshed to account for leakage from the storage capacitors.

In a read operation, a MOS access transistor can be turned on, connecting the corresponding storage capacitor to a bit line. As a result, a potential change can occur on the bit line according to whether the corresponding storage capacitor is charged or not charged. Typically, a data value can be sensed by a MOS transistor based sense amplifier.

Conventionally, even in an off state, an access transistor can leak current from its corresponding storage capacitor. This can be particularly true as transistor sizes continue to shrink. Thus, to account for more leakage, refresh rates can be increased, thus increasing power consumption, and/or capacitor size can be increased. However, larger capacitor sizes require more integrated circuit (die) area, leading to increased cost per die.

In addition to MOS access transistor leakage, another drawback to conventional DRAM devices can be susceptibility to radiation induced events, sometimes referred to as "single event upset" (SEU). In particular, SEU can result in a change in threshold voltage of a MOS transistor. That is, SEU can result in undesirably large leakage in a MOS access transistor. To compensate for such an event, a storage capacitor size can be increased, but this can lead to increased costs, as noted above. In the case of a sense amplifier MOS transistor, an SEU event can cause a mismatch in otherwise matching transistors, which can lead to erroneous data sensing.

BRIEF SUMMARY OF THE INVENTION

A dynamic random access memory (DRAM) device can include a plurality of memory cells. Each memory cell can include a charge storing structure and an access device comprising an enhancement mode junction field effect transistor (JFET). The DRAM device can further include a plurality of sense amplifiers that each generates an output value in response to a signal received at respective sense amplifier inputs, and a plurality of bit lines, each bit line coupling a plurality of memory cells to at least input of at least one of the sense amplifiers. A method can fabricate such devices.

BRIEF DESCRIPTION OF THE DRAWINGS

FIGS. 3A to 3F are side cross sectional views of DRAM devices according to various embodiments. FIGS. 3G-0 to 3G-1 are schematic diagrams of memory cells according to embodiments. FIG. 3H is a side cross sectional view showing an enhancement mode junction field effect transistor (JFET) that can be included in embodiments.

FIGS. 15A-0 to 15C-1 show various operations of an arrangement like that of FIG. 15.

DESCRIPTION OF THE EMBODIMENTS

Various embodiments of the present invention will now be described in detail with reference to a number of drawings. The embodiments show structures, methods of operation, and methods of manufacture for dynamic random access memory (DRAM) devices that can include junction field effect transistors (JFET) as access devices. Optionally, sense amplifiers for such DRAM devices can include bipolar junction transistors (BJTs).

Figure 1:
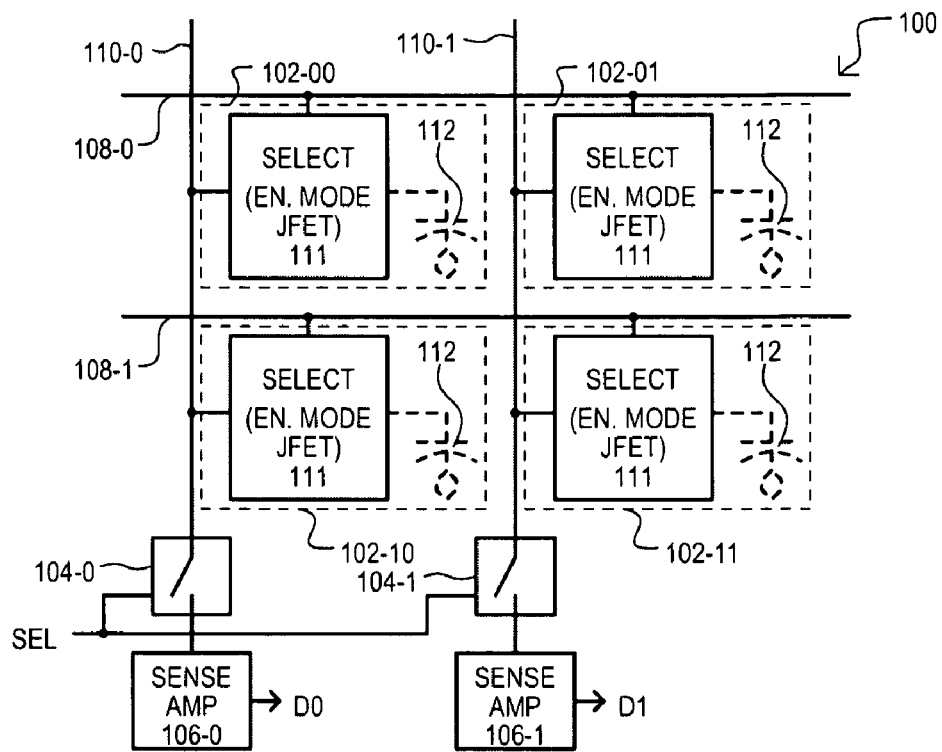
FIG. 1 is a block schematic diagram of a dynamic random access memory (DRAM) device according to one embodiment.
Figure 2:
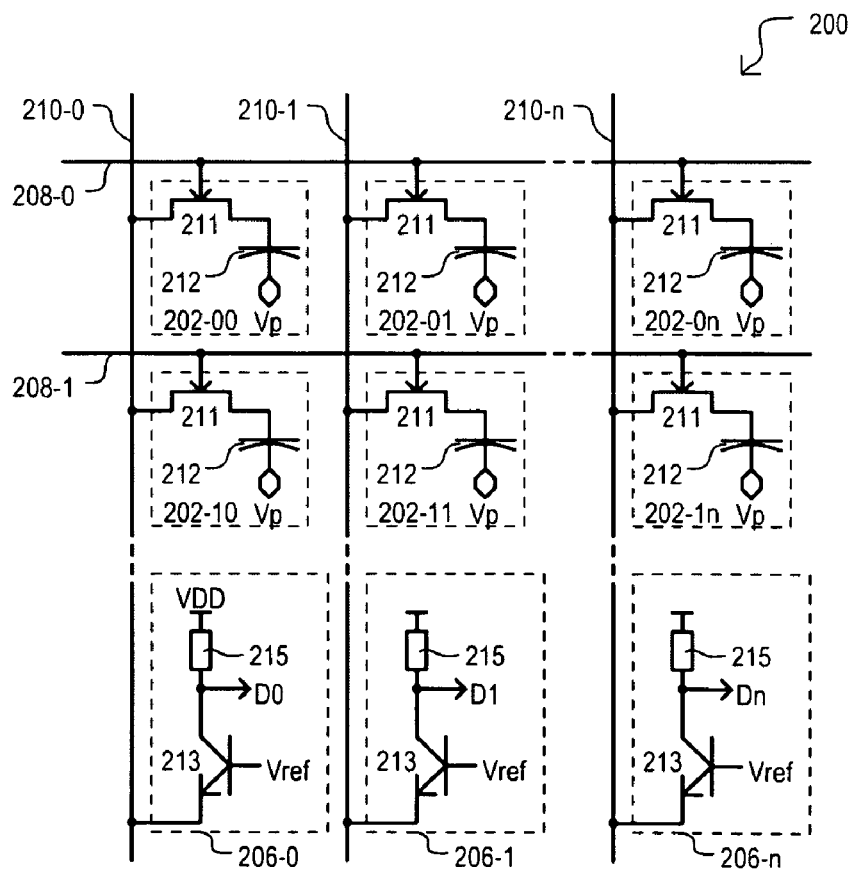
FIG. 2 is block schematic diagram of a DRAM device according to a second embodiment.

In the various embodiments shown, like items are referred by the same reference character but with the first digit corresponding to the figure number (e.g., memory cells are labeled "102" in FIG. 1, 202 in FIG. 2, etc.).

FIG. 1 shows a DRAM device according to a first embodiment. A DRAM device 100 can include memory cells 102-00 to 102-11, selection devices 104-0 and 104-1, and sense amplifiers 106-0 and 106-1. Memory cells of a same row can be connected to a common word line 108-0 or 108-1, while memory cells of a same column can be connected to a common bit line 110-0 or 110-1.

While FIG. 1 shows a two-by-two array, it is understood that this can represent but a portion of a much larger array. That is, the array structure of FIG. 1 can be repeated to have more memory cells per bit line and word line. This is the same for all array structures shown herein.

A memory cell (any of 102-00 to 102-11) can include an access transistor 111 and a charge storage structure (shown as a capacitor) 112. However, unlike a conventional DRAM, such access transistors 111 can be junction field effect transistors (JFETs), preferably enhancement mode JFETSs. Enhancement mode JFETs may not provide a conducting channel absent a gate voltage. Preferably, JFETs can have one or more gate structures that form depletion regions that extend into a channel absent an applied gate voltage, thereby creating a high impedance channel.

A charge storage structure 112 for each memory cell (102-00 to 102-11) can be a capacitor in contact with a source or drain terminal of an access JFET. Such a capacitor can be formed over a substrate such as a capacitor-over-bit line (COB) structure or a capacitor-under-bit line (CUB) structure (also called bit-line-over capacitor (BOC)). A charge storage structure can also be formed in the substrate, such as a trench capacitor having a substrate as one capacitor plate, a dielectric layer formed on surfaces of a substrate trench, and a second capacitor plate formed in the trench and separated from the substrate by the dielectric layer. Alternatively, a charge storage structure can be buried gate formed below a channel region, as will be described in more detail below.

By including JFETs as access devices, a DRAM can be more resistant to radiation events than conventional DRAMs. JFET devices may tolerate a larger total ionizing dose since they do not include a gate insulator. JFET devices may also be less susceptible to SEU because of the different channel structure as compared conventional MOSFETs.

Referring still to FIG. 1, word lines (108-0 or 108-1) can be commonly connected to gates of access JFETs of the same row. In response to a word line potential, access JFETs can be turned on (e.g., have relatively low source-drain impedance) or turned off (e.g., have relatively high source-drain impedance).

Bit lines (110-0 or 110-1) can provide read data paths, and optionally write (and/or refresh) data paths to a selected memory cell (102-00 to 102-11). In a read operation, a word line (108-0 or 108-1) can select on memory cell, and thereby connect the corresponding charge storage structure 112 to the bit line (110-0 or 110-1). This can result in a change in potential and/or current flowing in the bit line. Selection devices (104-0 and 104-1) can be enabled (by corresponding select signal SEL) resulting in the voltage/current change being applied to corresponding sense amplifiers (106-0 and 106-1).

Sense amplifiers (106-0 and 106-1) can detect a change in voltage/current of a corresponding bit line, to thereby generate an output value D0, D1. While sense amplifiers (106-0 and 106-1) can be formed from JFET devices, preferably, such circuits can include bipolar junction transistors (BJTs). BJTs may also be resistant to total ionizing dose and SEU, and also provide for fast detection of stored data values, as compared to MOS based sense amplifier designs.

FIG. 2 shows a DRAM device according to a second embodiment. In FIG. 2, memory cells 202-00 to 202-1n can each include an n-channel enhancement mode JFET (211) and a storage capacitor (212). Each JFET (211) can have a drain connected to a corresponding bit line (210-0 to 210-n), a gate connected to a corresponding word line (208-0 to 208-n), and source connected to a first terminal of the associated storage capacitor (212). A second terminal of each storage capacitor can receive a "plate" voltage Vp. A plate voltage (Vp) can be a constant voltage (e.g., 0 V) or can vary according to operation (e.g., read or write), as will be described in more detail below.

Referring still to FIG. 2, sense amplifiers (206-0 to 206-n) can include a first sense BJT (213) having an emitter connected to a corresponding bit line (210-0 to 210-n), a base connected to a reference node (Vref), and a collector that provides an output data value (D0 to Dn). A sense BJT (213) can be biased to generate a change in collector current in response to variations (or lack thereof) on the corresponding bit line arising from selection of a memory cell in a read operation. In the very particular example of FIG. 2, a collector of each sense BJT (213) can be connected to a sense reference node (in this case VDD), by a corresponding load impedance 215. Consequently, variations in collector current translate into variations in voltage at the collector.

While FIG. 2 shows n-channel JFETs as selection transistors, alternate embodiments can include p-channel JFETs. Further, FIG. 2 shows but one example of a sense amplifier having npn BJTs, alternate arrangements can include pnp BJTs, or JFET and even MOSFET based sense amplifiers.

It is understood that bit lines (210-0 to 210-n) can be connected to corresponding sense amplifiers (206-0 to 206-n) by intervening circuits, such as selection circuits, like decoded column selection circuits that select groups of bit lines based on a decoded address value.

Figure 3A:
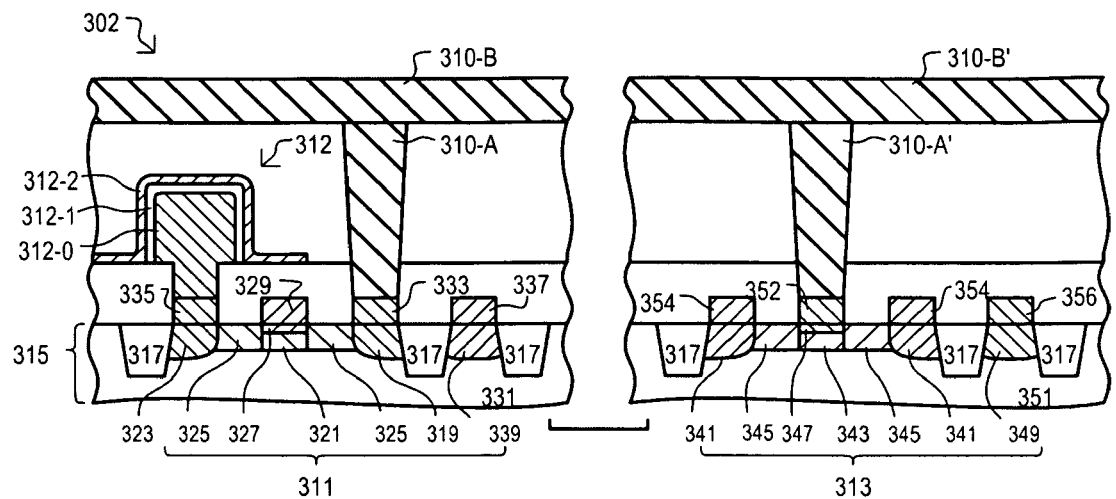
Figure 3B:
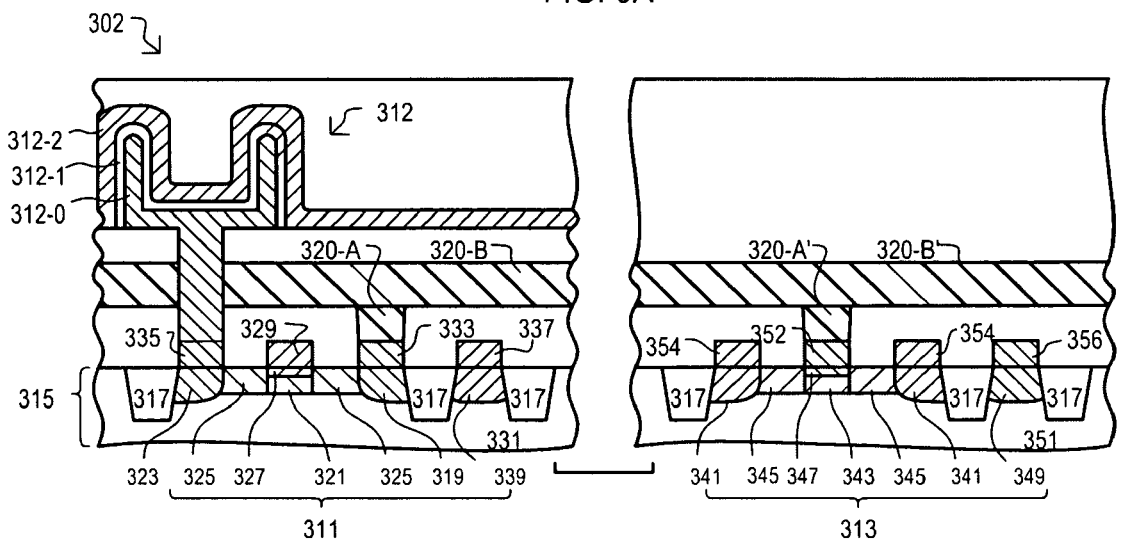
Figure 3C:
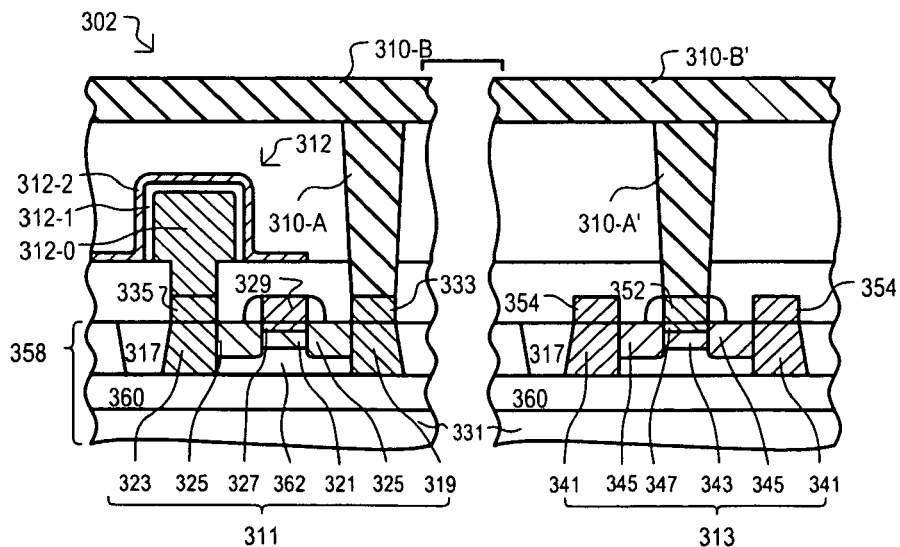

Referring now to FIG. 3A to 3C, various examples of a memory cell 302 and sense BJT (313), like those in FIG. 2, are shown in side cross sectional views. In the various examples shown, it will be assumed that the memory cell 302 includes an n-channel JFET and a capacitor 312, while sense BJT 313 is an npn type BJT. However, conductivity types for the structures can be switched to form a p-channel access JFETs and a pnp sense BJT.

FIG. 3A shows an access JFET (311) that can be formed in a substrate (315) that can include isolation structures (317), such as those formed by shallow trench isolation (STI) techniques.

Access JFET (311) can include various substrate regions doped to an n-type conductivity, including a drain substrate region (319), a channel substrate region (321), a source substrate region (323), and link regions 325. Source and drain substrate regions (323, 319) can be heavily doped (i.e., n+), while channel substrate (321) region can be more lightly doped. Link regions (325) may separate the channel region from the source/drain regions, and have doping level intermediate to such regions. Access JFET (311) can also include substrate regions doped to p-type conductivity, including a gate substrate region (327) under gate electrode (329), a bulk region (331) and a well contact region (339). Gate substrate and well contact regions (327 and 339) can be heavily doped (i.e., p+), while a bulk region (331) can be more lightly doped.

An access JFET (311) can also include electrode structures formed on a surface of, and in direct contact with substrate (315). Such electrode structures are preferably formed, at least in part, from a same layer of a deposited semiconductor material. As but one very particular example, a substrate (315) can include monocrystalline silicon (or silicon-germanium configurations such as "strained silicon"), while electrode structures can be formed, at least in part, from a same layer of polycrystalline silicon (polysilicon) and/or amorphous silicon. In FIG. 3A, access JFET (311) can include a drain electrode (333), a gate electrode (329), a source electrode (335), and a well electrode (337). Drain and source electrodes (333, 335), which can be highly doped to n-type conductivity can be in contact with drain substrate (319) and source substrate (323) regions, respectively. Gate and well electrodes (329, 337), which can be highly doped to p-type conductivity can be in contact with gate substrate (327) and well contact (339) regions, respectively.

Capacitor (312) can include a first plate 312-0, a capacitor dielectric (312-1), and a second plate (312-2). A first plate (312-0) can be in contact with source electrode (335) of access JFET (311). As but one example, a first plate (312-0) can be formed from a conductive material in ohmic contact with source electrode (335). Even more particularly, a first plate (312-0) can be polysilicon doped to a same conductivity type (in this example n-type) as source electrode (335). A capacitor dielectric (312-1) can be formed by oxidizing a first plate material. In addition or alternatively, a capacitor dielectric (312-1) can include a deposited layer, including but not limited to tantalum pentoxide, silicon nitride, or silicon oxynitride. A second plate (312-2) can be formed over capacitor dielectric (312-1). In one very particular example, while first plates may be individual per memory cell 302, a second plate (312-2) can be common to multiple memory cells.

FIG. 3A shows a capacitor-under-bit line (CUB, or bit line-over-capacitor (BOC)) arrangement. Thus, a bit line structure includes a contact portion 310-A and a wire portion 310-B. A contact portion 310-A can be formed from a conductive material in ohmic contact with drain electrode (333). Even more particularly, a contact portion 310-A can be a "plug", such as a tungsten plug, as but one very particular example. A wire portion 310-B can be formed from a patterned metallization layer, such as aluminum or copper, as but two examples.

Advantageously, a sense BJT (313) can have the same general structure as access JFET (311). However, in this case, because sense BJT (313) is an npn type BJT, doping can be of opposite conductivity type (i.e., like that of a p-channel JFET). In addition, it is understood that the doping profile, and region sizes of sense BJT (313) could vary from a corresponding p-channel JFET according to desired BJT properties (current gain (β), breakdown voltage, etc.).

Thus, sense BJT (313) in FIG. 3A includes two p+ base substrate regions (341, that can correspond to a source and drain substrate regions), a more lightly doped p-type base substrate region (343, that can correspond to a channel region), intermediately doped link regions (345), a p+ emitter substrate region (347, that can correspond to a gate substrate region), and a p+ collector contact region (349, that can correspond to a well contact region). A substrate can include an n-well (351) that can also form part of the BJT collector. Such an n-well can be formed in a p-type bulk (331).

Further, sense BJT (313) can include an n+ emitter electrode (352, that can correspond to a gate electrode), p+ base electrodes (354, that can correspond to source/drain electrodes), and an n+ collector electrode (356, that can correspond to a well electrode).

FIG. 3A also shows a sense amplifier input structure that includes a contact portion 310-A' and a wire portion 310-B'. A contact portion 310-A' can have the same structure as 310-A, but can be connected to emitter electrode (352). A wire portion 310-B' can have a same structure as wire portion 310-B.

It is noted that an access JFET (311) may not include a drain electrode (333), and a contact portion 310-A can make direct contact with a substrate 315. Similarly, a source electrode (335) can be excluded, and a first capacitor plate (312-0) can make direct contact with a substrate. The same is true for the sense BJT 313 structure: an emitter electrode (352) can be omitted and contact portion 310-A' can make direct contact with a substrate 315.

If electrodes 335, 333, 329, 337, 352, 354, 356 are formed from polysilicon or amorphous silicon, such electrodes preferably include a layer of silicide formed on a top surface.

FIG. 3B shows the same general arrangement as FIG. 3A, but with a capacitor-over-bit line arrangement. Thus, a first capacitor plate 312-0 can extend over a contact portion 320-A and wire portion 320-B, while capacitor dielectric (312-1) and second capacitor plate 312-2 can be formed above bit line wire portion 320-B.

FIG. 3C shows the same general arrangement as FIG. 3A, but with a silicon-on-insulator (SOI) type substrate. Thus, access JFET (311) can include a substrate insulator (360) formed over a bulk region 331. In addition, a backgate 362 can be formed on a side of the channel substrate region 321 opposite to that of gate substrate region 327. A backgate 362 can be doped to the same conductivity type as gate substrate region 327. Well and collector contacts are not shown, but can have various configurations, as will be described in more detail below.

FIG. 3D shows a side cross sectional view of an access JFET 311, that can be one version of that shown in FIGS. 3A to 3C. FIGS. 3A to 3C show JFET 311 as viewed by a cross section taken along the transistor channel length direction. In contrast, FIG. 3D shows an access JFET 311 taken along the channel width direction. FIG. 3D shows an example of a "gate wrap" access JFET 311. In a gate wrap JFET 311 a gate electrode 329 can be conductively connected backgate 362 by a gate substrate region 327 that occupies not only a top surface of the JFET active area, but also a side surface. Consequently, when a gate voltage is applied to gate electrode 329 the same voltage is driven on backgate 362, via side surface portions of gate substrate region 327. Optionally, a gate electrode 329 can extend downward on a side surface of a JFET active area (as shown by dashed lines). Such dual gate activation can allow for faster access JFET operation and/or greater off current control.

FIG. 3E shows a side cross sectional view of another access JFET 311', that can be another version of that shown in FIGS. 3A to 3C. FIG. 3E shows an example of a "floating backgate" access JFET 311'. In a floating back gate JFET 311', backgate 362 is not forced to any voltage, but rather allowed to float.

FIG. 3F shows a side cross sectional view of a further access JFET 311", that can be a version of that shown in FIGS. 3A to 3C. FIG. 3F shows an example of a back gate contact access JFET 311". In such an arrangement, backgate 362 can be driven by a separate backgate contact 364. As a result, a backgate 364 can be driven independently of a gate electrode 329 via backgate contact 364.

Figure 15:
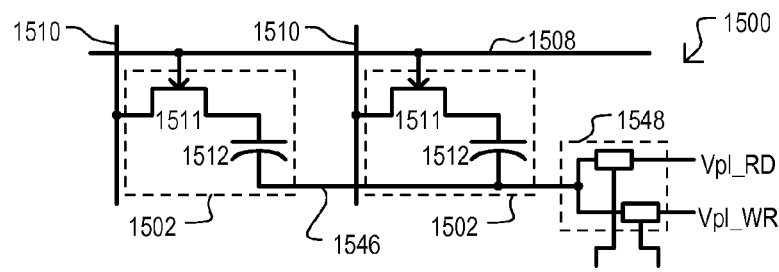
FIG. 15 is a schematic diagram showing a memory cell arrangement of a DRAM device according to an embodiment.
Figures 0, 15A:
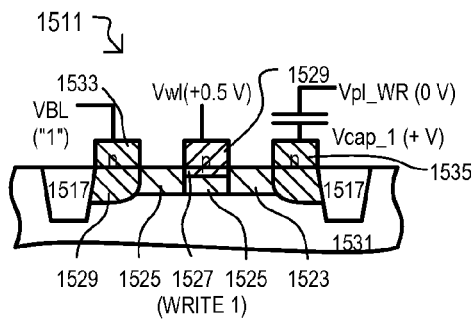
Figures 1, 15A:
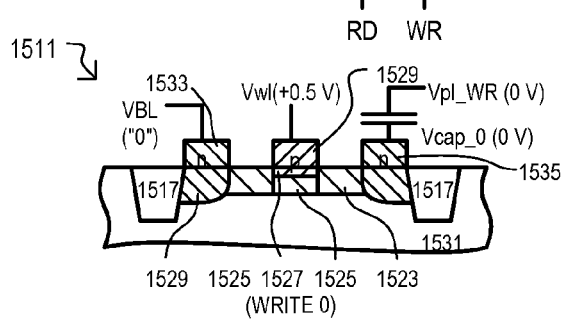
Figures 0, 15B:
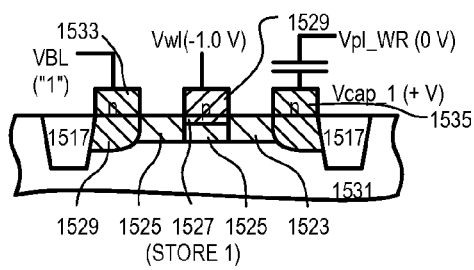
Figures 1, 15B:
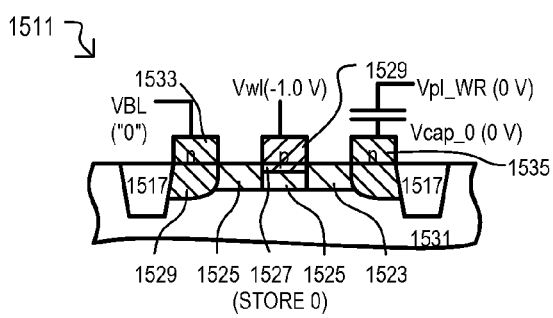

FIGS. 3G-0 shows a schematic diagram that can represent one version of a DRAM memory cell 302 that includes an access JFET 311 like that shown in FIG. 3D. As shown, a JFET 311 can have top gate (i.e., gate electrode 329 in combination with gate substrate region 327) and a backgate (i.e., 362) driven by a word line 308.

FIGS. 3G-1 shows a schematic diagram that can represent one version of a DRAM memory cell 302 that includes an access JFET 311" like that shown in FIG. 3F. As shown, a JFET 311" can have a top gate driven by a word line 308, while a backgate is driven by a separate backgate control terminal 366.

FIG. 3H shows an access JFET like that shown as 311 in FIG. 3C. FIG. 3H shows one example of how an access JFET can be an enhancement mode JFET. As shown, a zero bias depletion regions 367 from a gate substrate region 327 and backgate 362 can extend into oppositely doped channel substrate region 321, to thereby create a high impedance in the channel.

In this way, a DRAM can include a memory cell having an access JFET and sense amplifier BJT, where the JFET and BJT are formed in the same substrate, and include source, drain, gate, emitter, collector and base terminals formed from a same semiconductor layer. Such an arrangement can be more resistant to total ionizing dose and SEU events than conventional MOS based structures.

Figure 4:
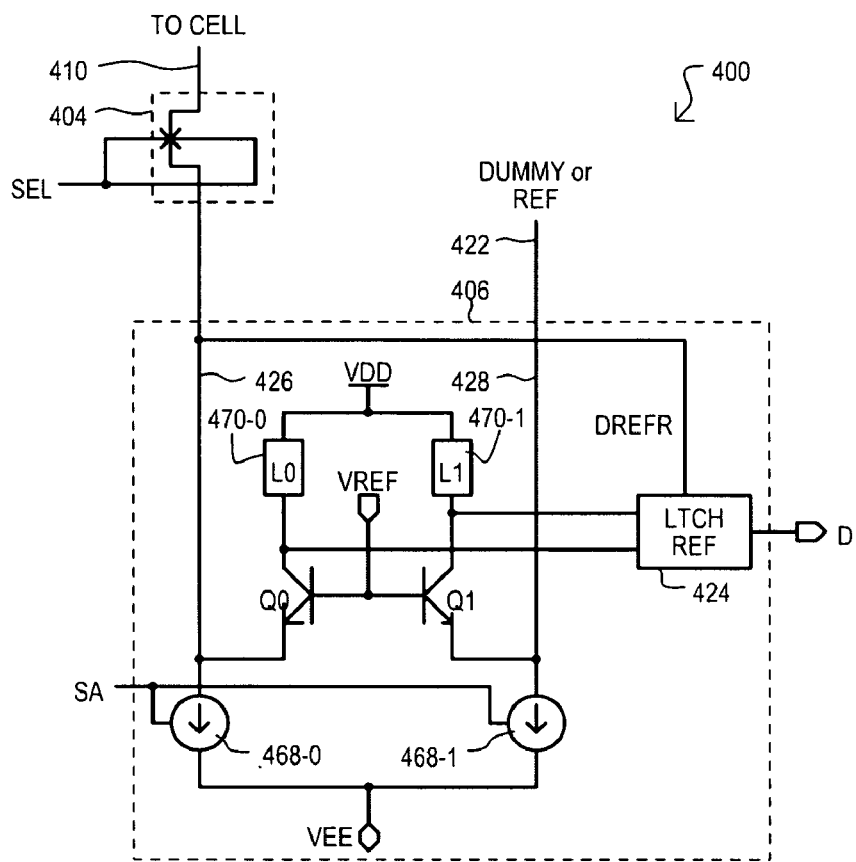
FIG. 4 is a schematic diagram of a selection device and sense amplifier arrangement according to an embodiment.

FIG. 4 shows a selection device and sense amplifier arrangement that can be included in the embodiments. FIG. 4 shows a selection device 404, a sense amplifier circuit 406, and a bit line 410. In the particular example shown, a selection device 404 can include an enhancement mode n-channel JFET. However, such a JFET can be configured for top and bottom gate operation. As but one example, a selection device 404 can have a structure like that of JFET (311) shown in FIGS. 3A to 3C, with a gate electrode (329) being driven as a first gate of the JFET and a well electrode (337) being driven as a second gate. In addition, a selection device 404 can have an arrangement like that shown in FIG. 3D or 3F. Such an arrangement can allow for an advantageously low impedance signal path between a bit line 410 and sense amplifier 406.

Sense amplifier 406 can include first and second sense BJTs (Q0, Q1) first and second current sources (468-0, 468-1), first and second loads (470-0, 470-1), and optionally a latch/refresh circuit 424. First sense BJT (Q0) can have a base connected to a reference node VREF, an emitter connected to a sense node 426, and a collector connected to first load (470-0). In a similar fashion, second sense BJT (Q1) can have a base connected to the reference node (VREF), an emitter connected to a compare node 428, and a collector connected to second load (470-0).

First and second loads (470-0, 470-1) can be connected between a power supply node (VDD) and the collectors of first and second sense BJTs, respectively.

Current sources (468-0 and 468-1) can be connected between a bias power supply node (VEE) and emitters of first and second sense BJTs (Q0, Q1), respectively. Current sources (468-0 and 468-1) can be enabled and disabled according to a signal SA. When enabled, current sources (468-0 and 468-1) can draw a constant current. When disabled, current sources (468-0 and 468-1) can draw essentially no current. In one very particular arrangement, a bias power supply node VEE can be driven to a negative voltage.

A latch/refresh circuit 424 can receive a differential voltage generated across the collectors of sense transistors (Q0 and Q1). Such a value can be latched to provide an output value D. Optionally, such a latched value (DREFR) can be fed back to sense node 426 to refresh the value stored in the accessed memory cell.

A compare node 428 can be driven to provide a reference signal to compare against a memory cell signal generated on sense node 426 in a read operation. As but two examples, such a signal can be reference current or voltage generated from a stabilized source, such as a band-gap type reference circuit. Alternatively, such a signal can be generated by a "dummy" memory cell that is accessed at the same time as a read memory cell, but configured to give a response essentially mid-way between a data value of "1" and "0".

Figure 5:
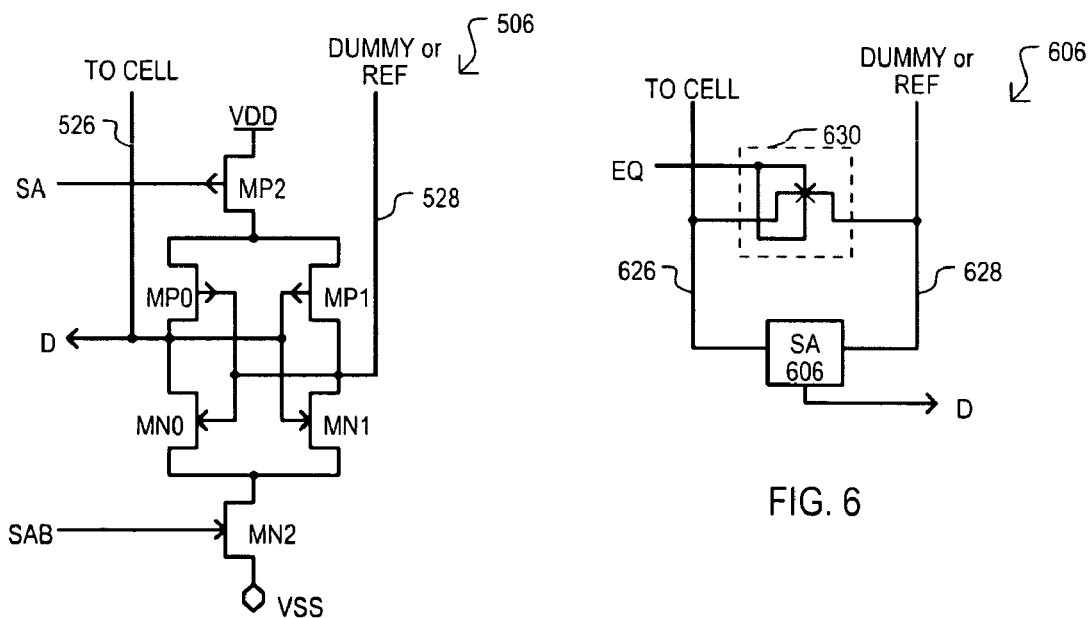
FIG. 5 is a schematic diagram of a sense amplifier that can be included in embodiments.

FIG. 5 shows a second example of a sense amplifier circuit 506 that can be included in the embodiments. Sense amplifier circuit 500 can include p-channel enhancement mode JFETs MP0-MP2, and n-channel enhancement mode JFETs MN0-MN2. Gates of JFETs MP0 and MN0 can be connected to a compare node 528 formed at the drain-drain connection of JFETs MP1 and MN1. Gates of JFETs MP1 and MN1 can be connected to a sense node 526 formed at a drain-drain connection of JFETs MP0 and MN0. JFET MP2 can connect the sources of transistors MP0 and MP2 to a power supply VDD in response to a sense enable signal SA. JFET MN2 can connect the sources of transistors MN0 and MN1 to a power supply VSS in response to an inverse sense enable signal SAB. In one very particular arrangement, a power supply VSS can be ground (e.g., 0 V).

Figure 6:
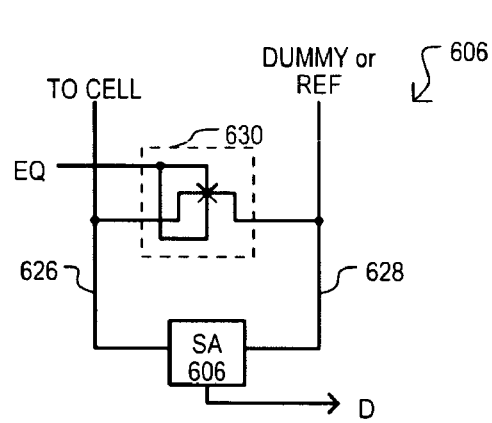
FIG. 6 is a schematic diagram of another sense amplifier circuit that can be included in embodiments.

FIG. 6 shows an equalization circuit arrangement according to an embodiment. FIG. 6 shows a sense amplifier circuit 606 and an equalization circuit 630. A sense amplifier circuit 606 can generate a data value D according to a comparison between a signal at compare node 628 and a sense node 626. As but one example, a sense amplifier circuit 606 can take the form of any the sense amplifier circuits shown herein, or equivalents.

An equalization circuit 630 can equalize a potential between sense and compare nodes (626 and 628), prior to a compare operation. In the very particular example shown, an equalization circuit 630 can have the same general structure as selection device 404 shown in FIG. 4 (an n-channel JFET configured to drive both top and bottom gates for very low source-drain impedance).

Figure 7:
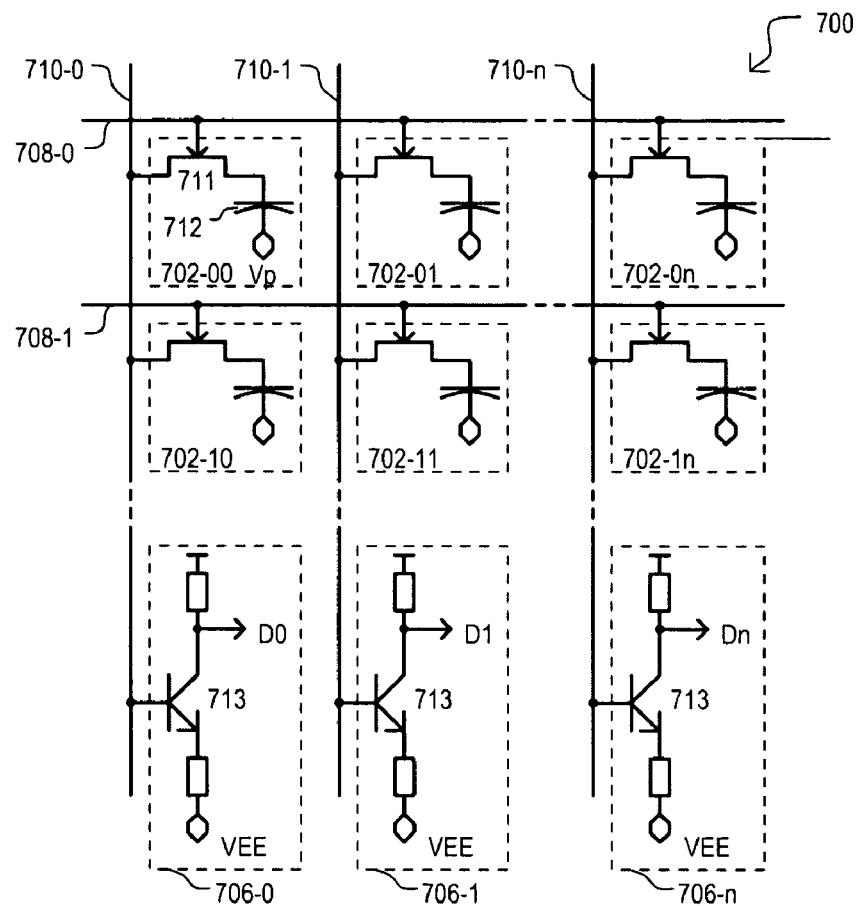
FIG. 7 is a schematic diagram of a DRAM device according to another embodiment.

FIG. 7 shows a DRAM device according to another embodiment. FIG. 7 shows an arrangement like that of FIG. 2, except that sense amplifiers (706-0 to 706-n) can sense a data value by way of base connections between sense BJTs (713) and bit lines (710-0 to 710-n).

Figure 8:
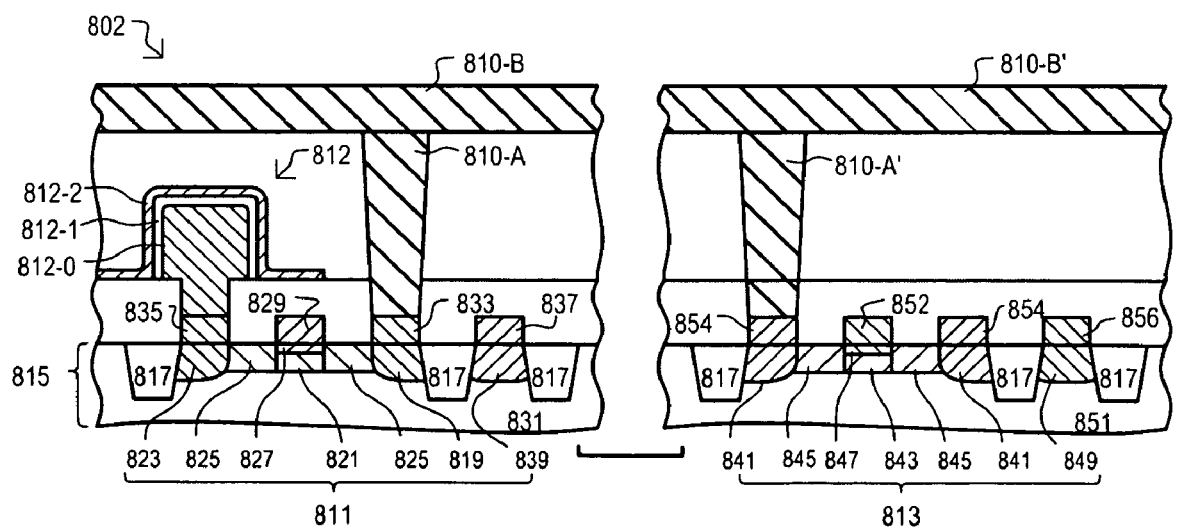
FIG. 8 is a side cross sectional view of a DRAM device according to a further embodiment.

FIG. 8 shows one example of a memory cell 802 and sense BJT (813), like those of FIG. 7. FIG. 8 shows similar structures as FIG. 3A. As in case of FIG. 3A, while FIG. 8 shows an n-channel JFET and npn BJT, conductivities could be switched in other embodiments. FIG. 8 differs from FIG. 3A in that it shows a contact to a base of sense transistor (813), rather than an emitter.

Figure 9:
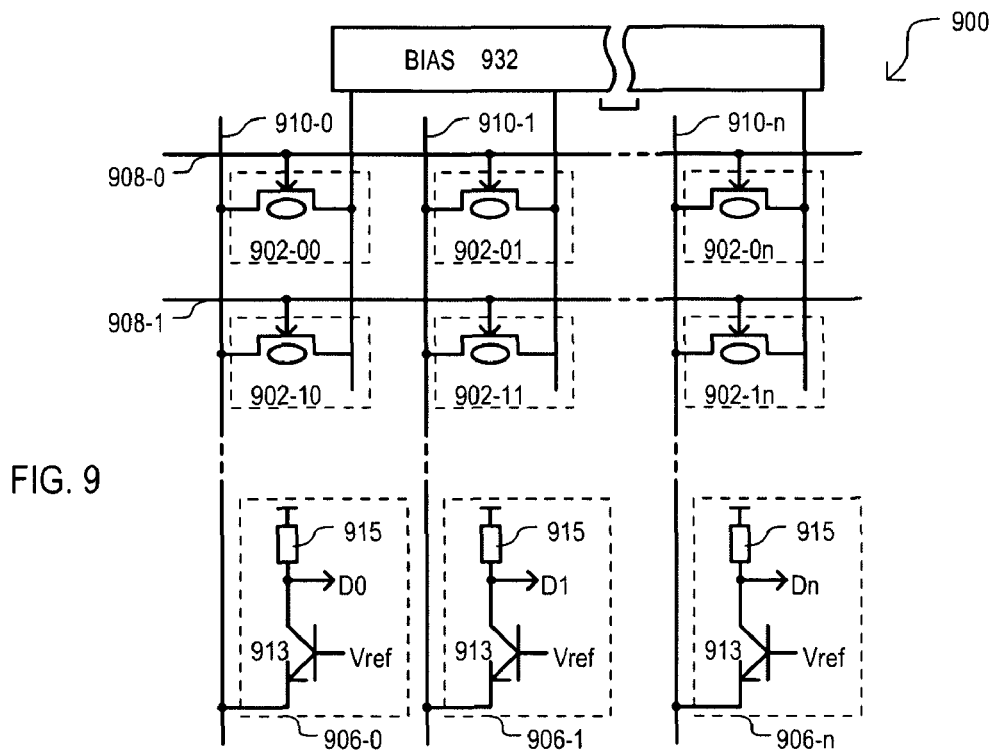
FIG. 9 is a schematic diagram of a DRAM device according to another embodiment.

FIG. 9 shows a DRAM device according to another embodiment. FIG. 9 shows an arrangement like that of FIG. 2, except that memory cells (902-00 to 902-1n) have diffusion isolated storage nodes, instead of capacitors, like those shown in FIG. 2. Such structures are referred to herein as storage node JFETs, and are shown and described in more detail in FIG. 10. FIG. 9 also shows a bias circuit 932. A bias circuit 932 can selectively apply a bias voltage to any of the memory cells of a group to write a data value to such memory cells.

Figure 10:
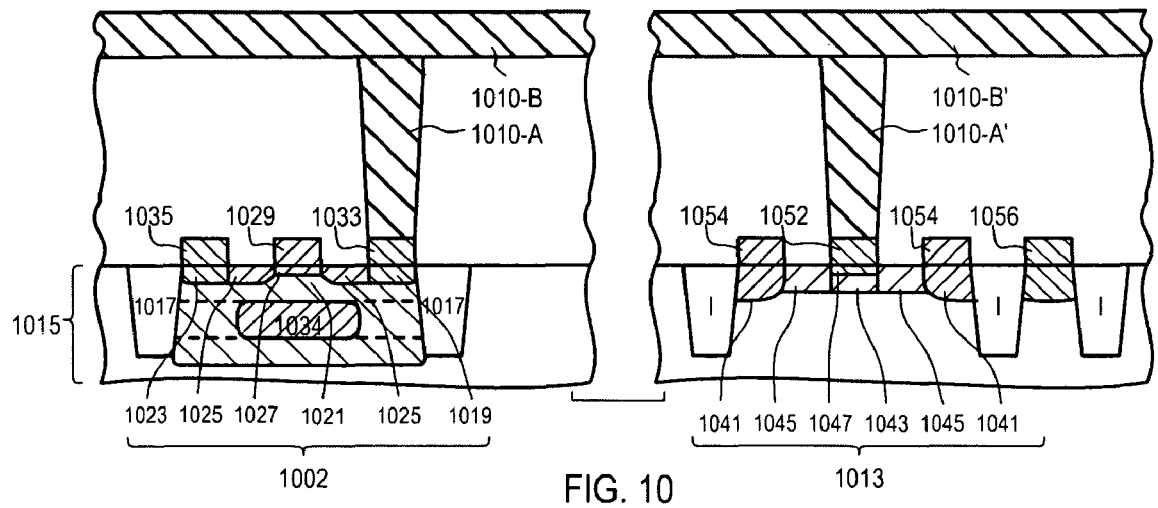
FIG. 10 is a side cross sectional view of a DRAM device according to a further embodiment.

FIG. 10 shows one example of a storage node JFET memory cell 1002 and sense BJT (1013), like those of FIG. 9. FIG. 10 shows similar structures as FIG. 3A, and can be subject to the same conductivity variations.

FIG. 10 differs from FIG. 3A in that it does not include a storage capacitor like that shown in FIG. 3. Instead it includes a diffusion isolated storage node 1034. Storage node 1034 can be a region of a substrate doped to a same conductivity type as a gate electrode (1029). Storage node 1034 can be completely surrounded by a region doped to an opposite conductivity type, or can extend to isolation structures (1017) (as indicated by dashed lines), while being separated from gate electrode (1029) and/or gate substrate region (1027) by oppositely doped channel region (1021). When charged, storage node 1034 can generate a depletion region that extends into channel region (1021), creating a relatively high impedance between source and drain, and thus indicating one stored data value. When not charged, storage node 1034 can have a smaller depletion region, creating a relatively low impedance between source and drain, and thus indicating another stored data value.

Figure 11:
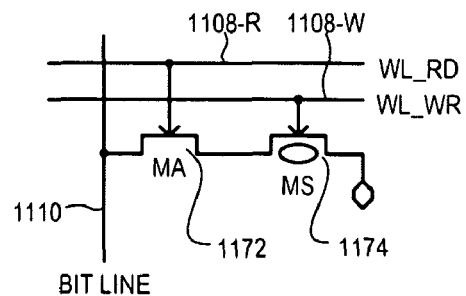
FIG. 11 is a schematic diagram of a memory cell according to another embodiment.

FIG. 11 shows an alternate memory cell structure that can be included in the embodiments. FIG. 11 includes the same memory cell structure as FIGS. 10 and 11 but adds an access enhancement mode JFET (1172) in series with a storage node JFET (1174). In such an arrangement, a read word line 1108-R can be connected to a gate of access JFET (1172), while a write word line 1108-W can be connected to a gate of storage node JFET (1174).

Figure 12:
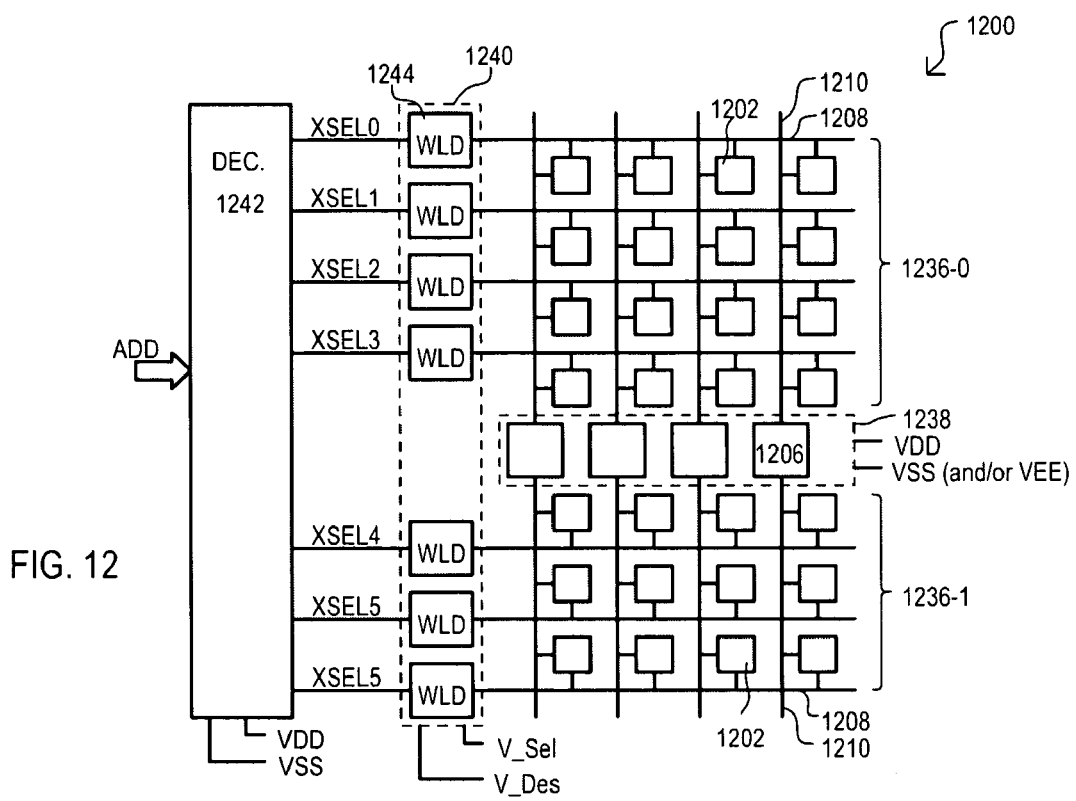
FIG. 12 is a schematic diagram of a DRAM device according to another embodiment.

Referring now to FIG. 12, a DRAM device 1200 according to yet another embodiment is shown in a top plan view. FIG. 1200 shows memory cells (two shown as 1202) arranged into a first array 1236-0 and second array 1236-1. Each array has bit lines (two shown as 1210) and word lines (two shown as 1208). Memory cells (1202), bit lines (1210), and word lines (1208) can take any of the forms described herein or equivalents.

FIG. 12 also shows a sense amplifier bank 1238, a word line driver bank 1240, and a decoder circuit 1242.

A sense amplifier bank 1238 can include sense amplifier circuits (one shown as 1206) connected to one bit line of each array (1236-0/1). Each sense amplifier circuit 1206 can include selection devices and sense amplifiers according to any of the embodiments herein, or equivalents. In the event sense amplifier bank includes JFET devices, the sense amplifier bank 1238 can receive power supply voltages VDD and VSS. In one very particular example, VDD can be at or about +0.5 V and VSS can be at or about 0 V. Alternatively, if a sense amplifier bank 1238 includes BJT devices, sense amplifier bank 1238 can receive a power supply voltages VEE. In one very particular example, VEE can be a negative voltage suitable for biasing the BJT sense devices.

FIG. 12 shows an example of an "open" bit line configuration. Thus, in a read operation, a memory cell can be connected to a bit line in one array, while the bit line from the other array can serve as a reference line, or can be isolated from a sense amplifier.

A word line driver bank 1240 can include a word line driver (one shown as 1244) connected to each word line (1208). Word line driver bank 1240 can receive a select voltage V_Sel and a deselect voltage V_Des. In one arrangement, memory cells 1202 can include n-channel enhancement mode JFET devices, and a select voltage can be at or about +0.5 V and a deselect voltage can be at or about –1.0 V. Such a deselect voltage can result in advantageously low leakage access devices, as compared to conventional approaches. Alternatively, a select voltage can be at or about +0.5 V and a select voltage can be at or about 0 V.

A decoder circuit 1242 can include logic for decoding address signals ADD into row select signals XSEL0 to XSEL5 that provide inputs to word line drivers (1244). Preferably, such logic can be composed of JFET devices. A decoder circuit 1242 can operate between logic power supply levels VDD and VSS. In one arrangement, a voltage VDD can be at or about +0.5 V and a voltage VSS can be at or about 0 V.

It is understood that word lines can be contiguous structures formed from the electrode layer (e.g., doped polysilicon or amorphous silicon with silicide) that span multiple memory cell areas. Alternatively, such structures can be "strapped" (i.e., commonly connected to a low resistivity line, such as a metal line).

Figure 13:
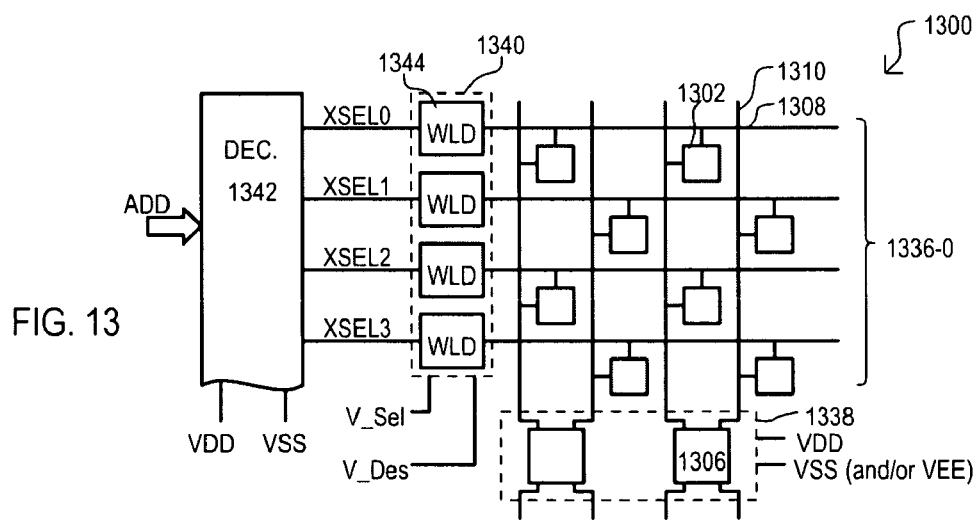
FIG. 13 is a schematic diagram of a DRAM device according to another embodiment.

FIG. 13 shows a DRAM device 1300 according to a further embodiment in a top plan view. FIG. 13 shows similar structure as that of FIG. 12, but is an example of a folded bit line arrangement. In such an arrangement, in a read operation, a pair of bit lines 1310 from a same array (e.g., 1336-0 or 1336-1) can be connected to a sense amplifier. One bit line can be connected to a memory cell while the other bit line can serve as a reference line, or can be isolated from a sense amplifier. Bit lines from the other array (e.g., 1336-1 or 1336-0) can be isolated from the sense amplifier.

Figure 14:
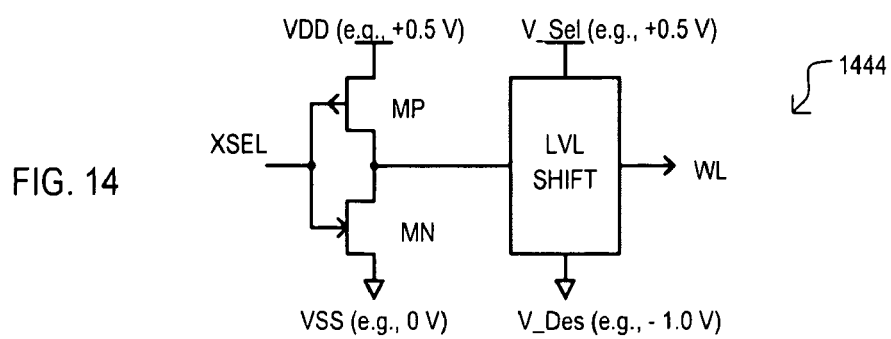
FIG. 14 is a schematic diagram of a level shifter circuit that can be included in embodiments.

FIG. 14 shows one example of a word line driver circuit, like that shown as 1244 in FIG. 12 and/or 1344 in FIG. 13. Word line driver circuit 1444 can include logic circuit MN/MP that can operate between logic levels VDD and VSS. Logic circuit MN/MP is shown as an inverter formed by JFETs, but can be other logic such as AND, NAND, OR, or NOR circuits, as but a few examples. An output from logic circuit MN/MP can be provided to a level shift circuit 1476. Level shift circuit (1476) can translate logic levels VDD/VSS into shifted logic levels V_Sel/V_Des. FIG. 14 shows an example of a level shift circuit that can provide a shifted deselect voltage V_Des that can place an enhancement mode n-channel JFET into an advantageously low leakage state with a negative voltage.

As noted above, for DRAM devices with storage capacitors, embodiments can include a second capacitor plate common to multiple storage capacitors. Such an arrangement is shown in FIG. 15.

FIG. 15 shows two memory cells 1502 that include storage capacitors (1512) having a common second plate 1546. Second plate 1546 can be driven to a plate voltage Vpl.

FIGS. 15A-0 to 15C-1 show various operations of an arrangement like that of FIG. 15.

FIG. 15A-0 shows a write operation. In the write operation, a gate voltage can be applied to a word line that places the access JFET into a low impedance state. In this example, such a voltage can be +0.5 V. In FIG. 15A-0, a write "1" operation can result in a positive voltage being generated at a first capacitor plate. In a write "0" operation, a zero voltage value can be generated on a first capacitor plate. A second capacitor plate 1546 (common to multiple memory cells) can be driven to plate voltage, Vpl, which in this case can be 0 V.

FIG. 15A-1 shows a store operation that retains a written data value. In the store operation, a gate voltage can be applied that places the access JFET 1511, which is an enhancement mode device, into a high impedance state. In this example, such a voltage can be –1.0 V. Such a turn off voltage may provide for advantageously small leakage currents through the access transistor, as compared to a MOS type access transistor. Alternatively, such a voltage can be 0 V, and the leakage current through the access transistor, which is an enhancement mode device, will not be as small.

FIG. 15A-2 shows a read operation. In the read operation, a gate voltage can be applied to a word line that places the access JFET 1511 into a low impedance state. In this example, such a voltage can be +0.5 V. At the same time, a second capacitor plate can be at the plate voltage Vpl, which in this example is 0 V.

Figures 0, 15C:
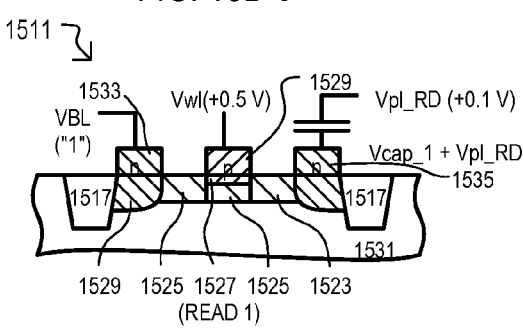
Figures 1, 15C:
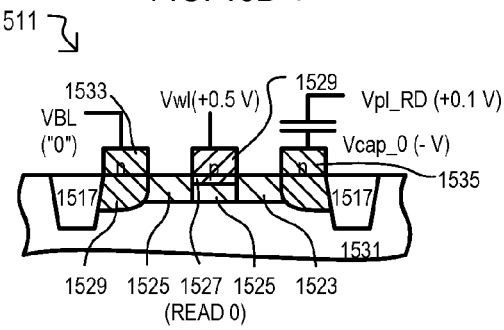

While FIGS. 15A-0 to 15C-0 show an arrangement that can result in a voltage of +0.5 V across plates of a storage capacitor, it may be desirable to reduce the electric field across a storage capacitor, to reduce the stress placed on the capacitor dielectric. This can increase the reliability of a DRAM device. One arrangement for reducing the electric field is shown in FIGS. 15A-1 to 15C-1.

FIGS. 15A-1 to 15C-1 show the same general arrangement as FIGS. 15A-0 to 15C-0, but with the common second capacitor plate 1546 being driven to an intermediate voltage, which in this case is +0.25 V.

Figure 16A:
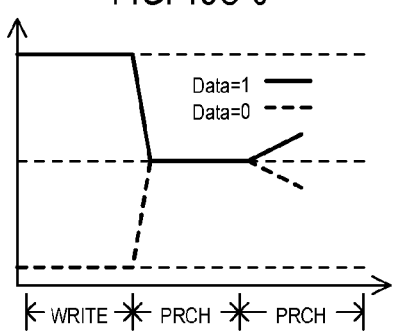
FIGS. 16A and 16B are timing diagrams showing examples of voltage levels for a circuit like that of FIG. 15.

FIG. 16A is a timing diagram showing a bit line voltage (VBL) for a write operation, precharge operation, and read operation for an arrangement like that shown in FIGS. 15A-0 to 15C-1. In the precharge operation, the DRAM memory cell can be in the store condition, while the bit line is precharged to an intermediate voltage (e.g., +0.25 V). In FIG. 16A, a solid line shows operations for a data value of "1", while a dashed line shows operations for a data value of "0".

Figure 16B:
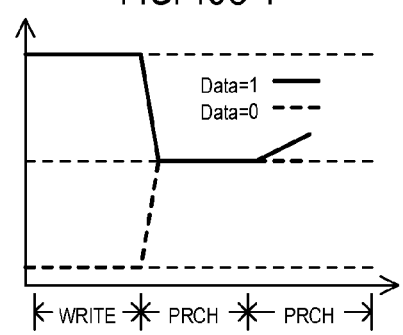

FIG. 16B is a timing diagram like that of FIG. 16A, but for an arrangement like that shown in FIGS. 15A-1 to 15C-1.

Figure 17:
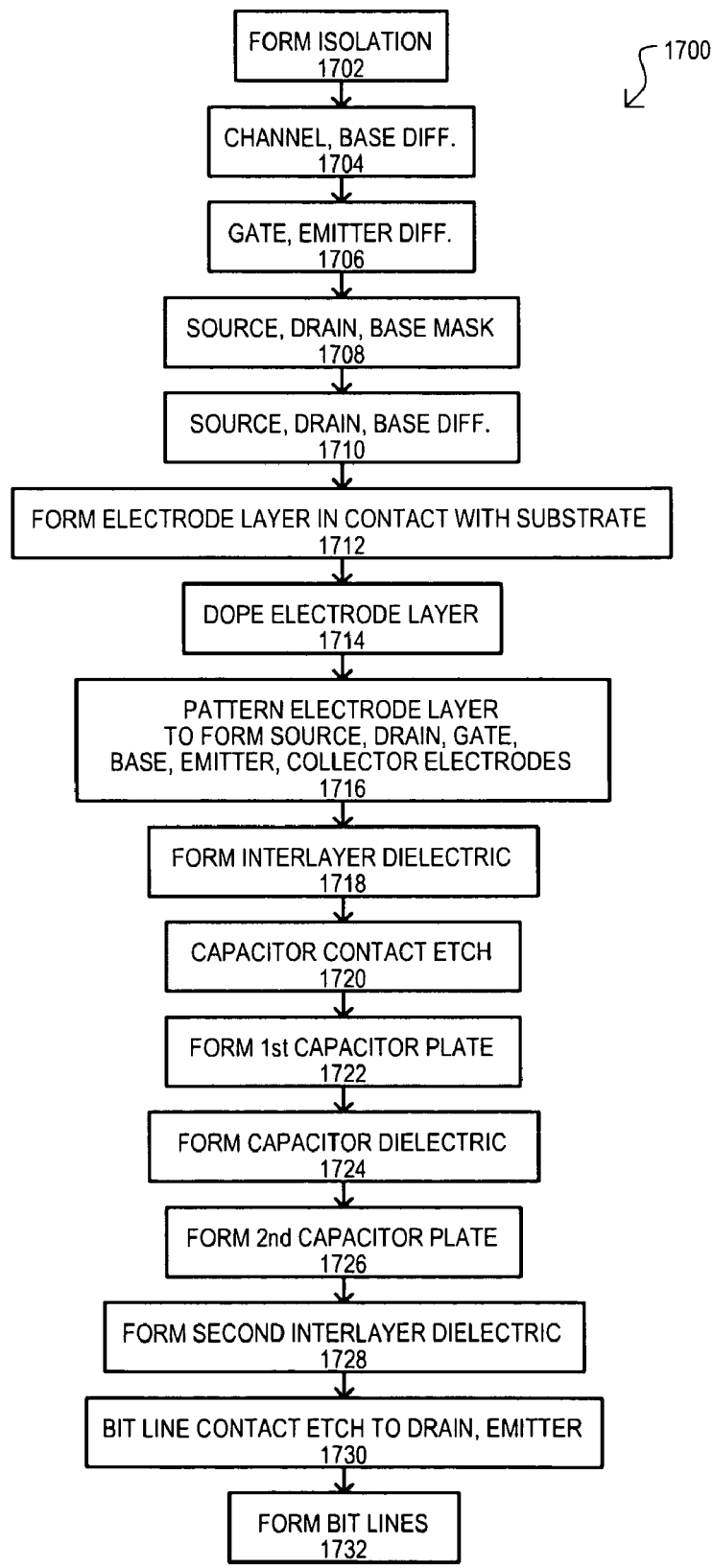
FIG. 17 is a flow diagram showing a method of manufacturing a DRAM device according to an embodiment.

FIG. 17 shows a method of forming a DRAM device according to one embodiment. FIGS. 18A to 18J show various side cross sectional views of one example of a DRAM device after various steps in FIG. 17.

Figure 18A:
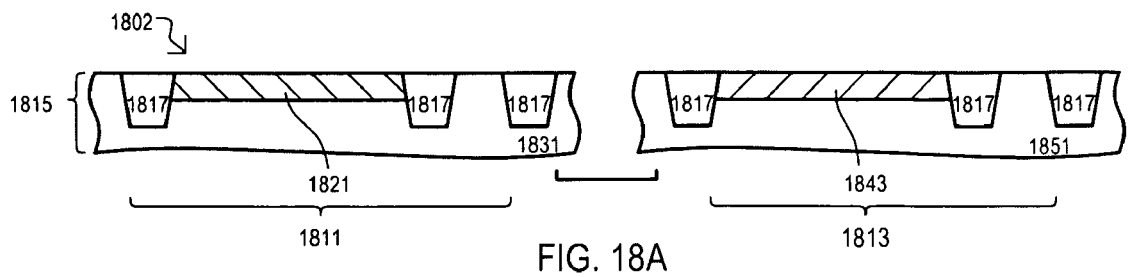
FIGS. 18A to 18J are a series of side cross sectional views showing one example of a method like that of FIG. 17.

A method 1700 can include forming isolation structures in a substrate (step 1702). Such a step can include forming STI isolation structures (1817) in a p-type bulk portion of a substrate and in an n-well portion of a substrate. A substrate can then be subject to the formation of channel (1821) and base (1843) diffusion regions (step 1704). Such a step can include separate ion implantation steps, one to form a channel region (e.g., an n type region in a p-type bulk) and a base region (e.g., a p-type region in an n-type substrate). Such implant operations can include appropriate masking for the second steps. FIG. 18A shows one example of a DRAM device after such a step. A substrate 1815 can alternately be a semiconductor-on-insulator substrate, such as a silicon-on-insulator (SOI) substrate. In such a case, isolation structures 1817 would extend through a semiconductor region to an isolation layer running below, and parallel to a top surface of the substrate.

Figure 18B:
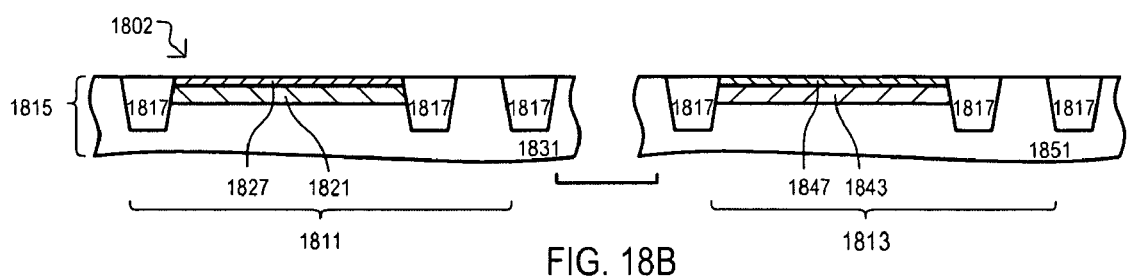

A method 1700 can further include forming a gate diffusion region and emitter diffusion region (step 1706). Such a step can include separate ion implantation steps, at energies sufficient to form a gate diffusion region within a channel region and an emitter diffusion region within a base region. FIG. 18B shows one example of a DRAM device after such a step. Alternatively, the gate substrate regions 1827 and emitter substrate regions 1847 can be formed by the diffusion of dopants from gate electrode 1829 or emitter electrode 1852 into the substrate after deposition, doping, and patterning of the electrode layer in step 1716.

Figure 18C:
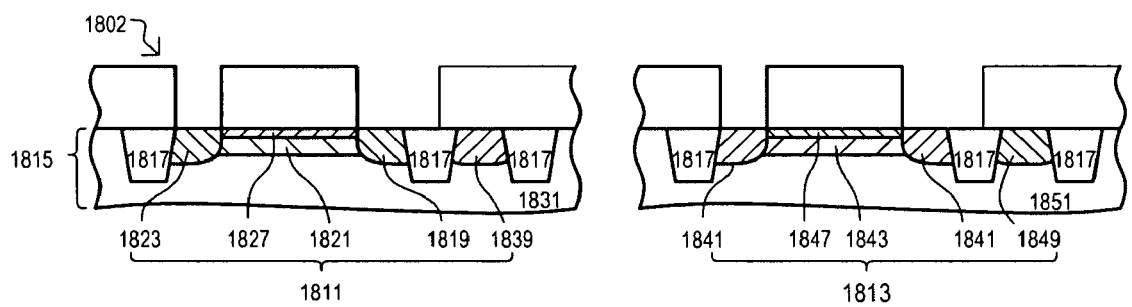

Method 1700 also includes forming a source, drain and base mask (step 1708). Such a step can mask a substrate except for those portions where source and drain regions are to be formed. An ion implantation step can then form highly doped source and drain regions in a substrate. Similarly, a substrate can be masked except for those portions where base regions are to be formed. An ion implantation step can then form highly doped base regions in a substrate. FIG. 18C shows one example of a DRAM device after such steps. Alternatively, the highly doped source and drain regions (1823 and 1819) can be formed by the diffusion of dopants from source electrode 1835 and drain electrode 1833 or base electrodes 1854 and collector electrode 1856 into the substrate after deposition, doping, and patterning of the electrode layer in step 1716.

Figure 18D:
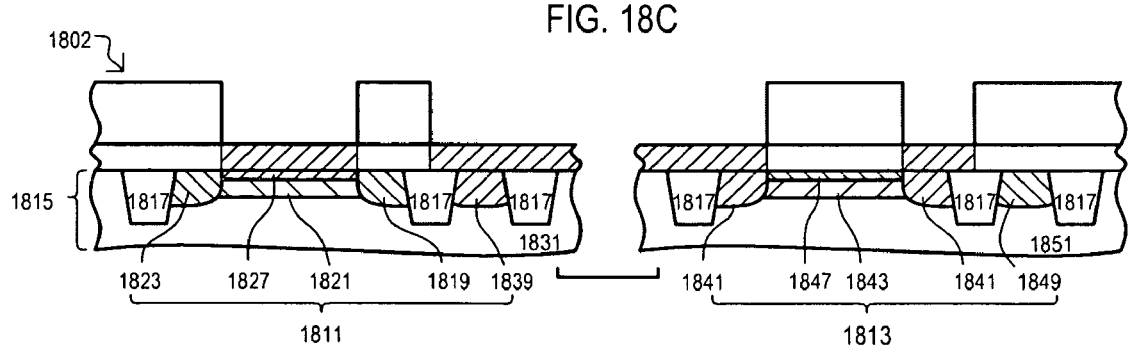
Figure 18E:
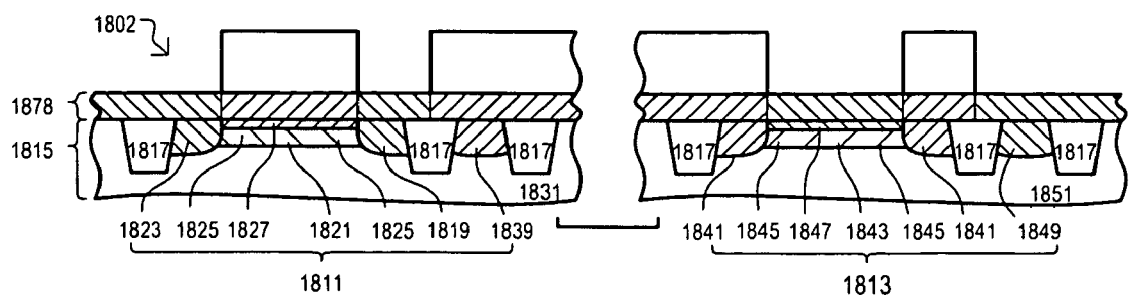
Figure 18F:
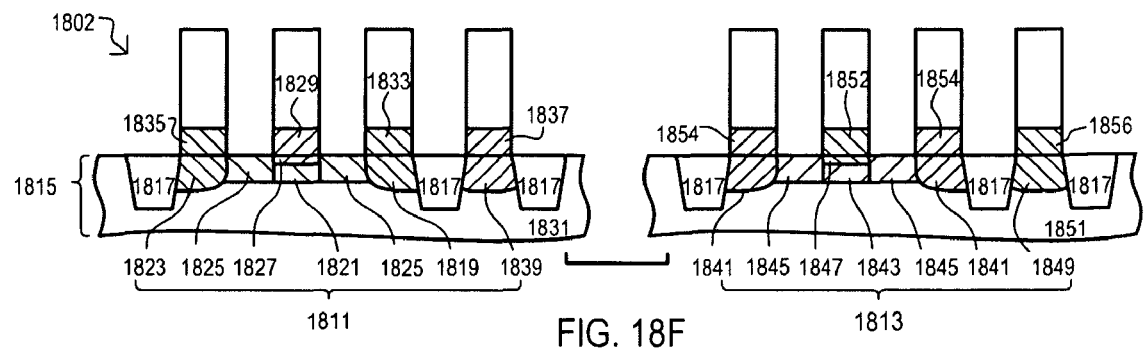
Figure 18G:
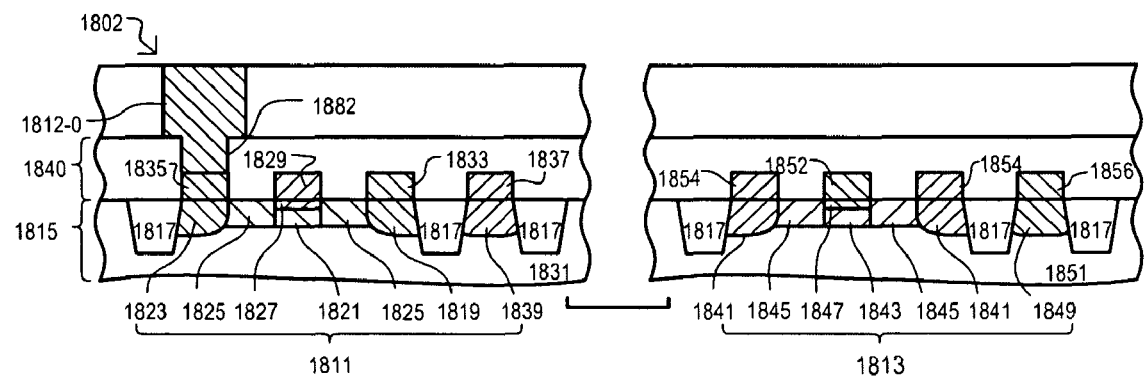

A method 1700 can continue by forming an electrode layer 1878 in contact with a substrate (step 1712). Such a step can include depositing a layer of polysilicon or amorphous silicon on a substrate. Such an electrode layer 1878 can then be doped to form n+ and p+ portions (step 1714). FIG. 18D shows an example of a DRAM device after forming p+ regions in electrode layer 1878. FIG. 18E shows an example of a DRAM device after subsequently forming n+ regions in electrode layer 1878. An electrode layer can then be patterned to create source, drain, gate, base, collector, and emitter electrodes (step 1716). Such a step can include forming an etch mask over the electrode layer and then etching with a reactive ion etch (RIE). FIG. 18F shows an example of a DRAM device after such a step. [The FIG. 18F shows the mask layer still on top of the (polysilicon) electrode layer.] Intermediately doped base and link regions (1825, 1845) can then be formed. In one arrangement, such a step can include a self-aligned ion implantation step that utilizes the gate structures as part of an implantation mask. Such a step can also include an annealing step to cause diffusion of dopants from the electrode layer into the substrate to form highly doped regions 1827, 1823, 1819, 1847, 1843, and 1849. A layer of silicide can also be formed on a top surface of the electrode layer 1878.

A first interlayer dielectric 1880 can then be formed (step 1718). A capacitor contact hole 1882 can be etched through the first interlayer dielectric layer (step 1720). Such a step can include etching through the first interlayer dielectric to expose a source electrode 1835 of access JFET 1811. A first capacitor plate 1812-0 can then be formed (step 1722). In the particular example of FIG. 18G, this can include forming a plate structure that extends into the capacitor contact hole to the source electrode 1835.

Figure 18H:
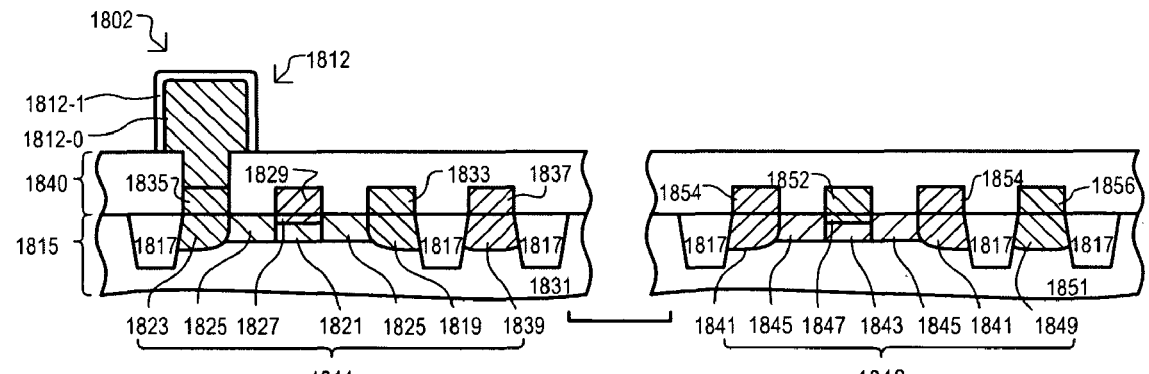

A capacitor dielectric 1812-1 can then be formed on the first capacitor plate 1812-0 (step 1724). As noted above, such a step can include oxidizing a first plate structure and/or depositing one or more dielectric layers. FIG. 18H shows an example of a DRAM device after such a step.

Figure 18I:
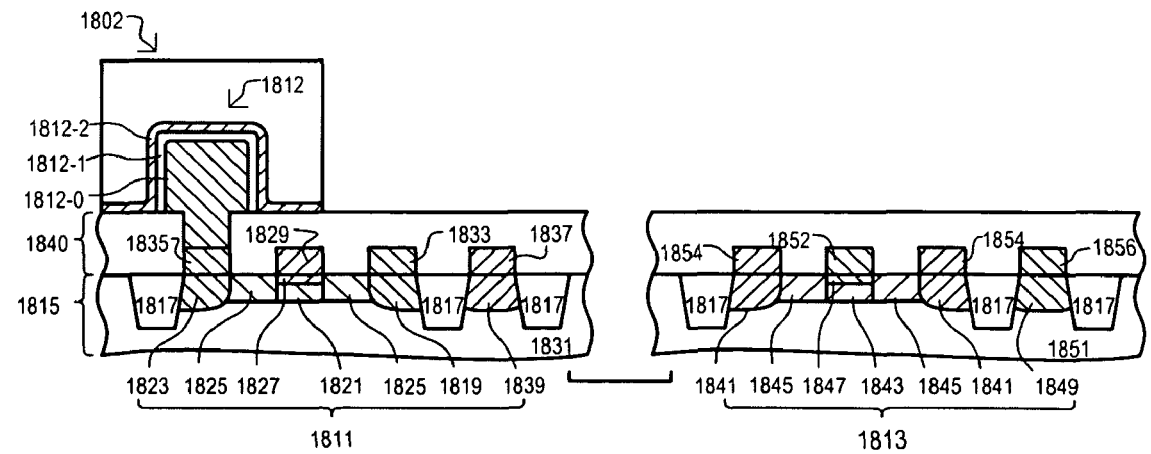

A second capacitor plate 1812-2 can then be formed on a capacitor dielectric 1812-1 (step 1726). Such a step can include depositing a common conductive layer over multiple first plates to form a common plate, and patterning such a common plate. FIG. 18I shows an example of a DRAM device after such a step.

Figure 18J:
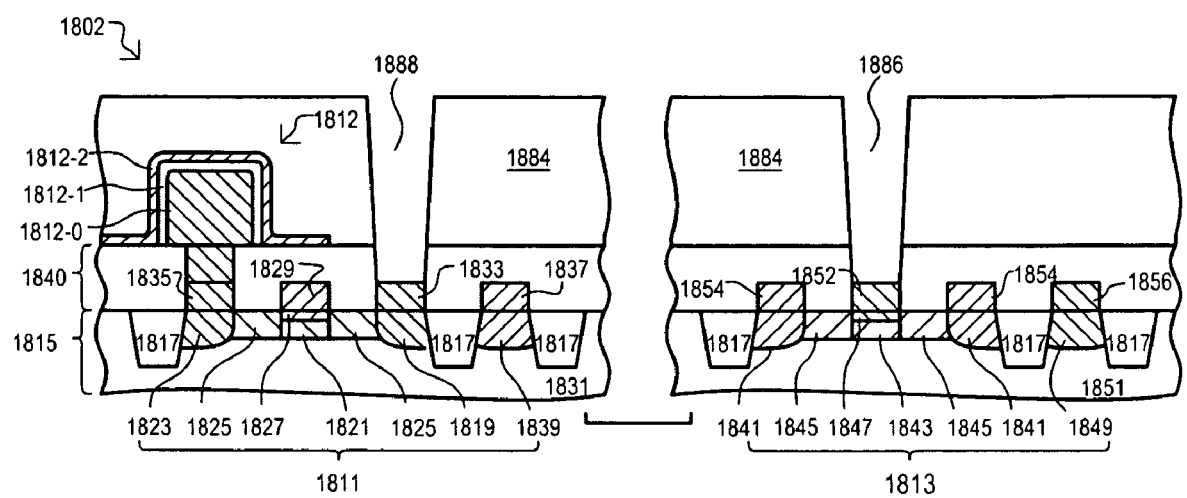

A second interlayer dielectric 1884 can be formed (step 1728). A bit line contact hole 1888 can be etched through the first and second interlayer dielectric layers (1880 and 1884) (step 1730). Such a step can include etching to expose a drain electrode 1833 of access JFET 1811 and an emitter electrode 1852 (or in other variations, a base electrode 1854) of a sense BJT 1813. FIG. 18J shows an example of a DRAM device after such a step.

A bit line can then be formed (step 1732). Such a step can include forming a conductive material within a bit line contact hole (e.g., a plug). A conductive layer can then be formed over and in contact with such plugs. Such a layer can then be patterned to form a bit line. FIG. 3A shows an example of a DRAM device after such a step.

Reference in the description to "one embodiment" or "an embodiment" means that a particular feature, structure, or characteristic described in connection with the embodiment is included in at least one embodiment of the invention. The appearance of the phrase "in one embodiment" in various places in the specification do not necessarily all refer to the same embodiment. The term "to couple" or "electrically connect" as used herein may include both to directly and to indirectly connect through one or more intervening components.

Further it is understood that the embodiments of the invention may be practiced in the absence of an element or step not specifically disclosed. That is, an inventive feature of the invention may include an elimination of an element.

While various particular embodiments set forth herein have been described in detail, the present invention could be subject to various changes, substitutions, and alterations without departing from the spirit and scope of the invention.

What is claimed is:

1. A dynamic random access memory (DRAM) device, comprising:
 a plurality of memory cells, each memory cell including an access junction field effect transistor (JFET) having at least a gate electrode and a drain electrode formed from a semiconductor layer and in physical contact with a semiconductor substrate; and at least one sense amplifier coupled to selected of the memory cells, the sense amplifier including a sense bipolar junction transistor (BJT) having an emitter electrode formed from the semiconductor layer and in physical contact with the semiconductor substrate; wherein, the sense BJT includes a first base region comprising a first portion of the semiconductor substrate doped to one conductivity type, a second base region comprising a second portion of the semiconductor substrate doped to the one conductivity type, a lightly doped base region formed below the emitter electrode comprising a third portion of the semiconductor substrate doped to the one conductivity type, a first base intermediate region disposed between the first base region and the lightly doped base region comprising a fourth portion of the substrate doped to the one conductivity type, and a second base intermediate region disposed between the second base region and the lightly doped base region comprising a fifth portion of the substrate doped to the one conductivity type.

2. The DRAM device of claim 1, further including:

a plurality of bit lines;

a plurality of select circuits, each comprising a JFET having a source-drain path coupled between one of the bit lines and at least one sense amplifier, and the sense bipolar transistor of each sense amplifier has at least one terminal coupled to one of the bit lines by one of the select circuits.

3. The DRAM device of claim 1, wherein:

the sense bipolar transistor of each sense amplifier is coupled to selected memory cells at its base terminal.

4. The DRAM device of claim 1, further including:

the sense bipolar transistor of each sense amplifier is coupled to selected memory cells at its emitter terminal.

5. The DRAM device of claim 1, wherein:

each access JFET further includes a drain region below and in contact with the drain electrode comprising a first portion of the semiconductor substrate doped to one conductivity type, a source region comprising a second portion of the semiconductor substrate doped to the one conductivity type, a channel region formed below the gate electrode comprising a third portion of the semiconductor substrate doped to the one conductivity type, a first link region disposed between the drain region and the channel region comprising a fourth portion of the substrate doped to the one conductivity type, and a second link region disposed between the source region and the channel region comprising a fifth portion of the substrate doped to the one conductivity type, wherein the source and drain regions have a higher dopant concentration than the first and second link regions, which have a higher dopant concentration than the channel region.

* * * * *